United States Patent [19]

Ward et al.

[11] Patent Number: 4,665,463
[45] Date of Patent: May 12, 1987

[54] ELECTROSTATIC CHUCK

[75] Inventors: Rodney Ward, Crawley; Ian H. Lewin, Forest Row, both of United Kingdom

[73] Assignee: U.S. Philips Corporation, New York, N.Y.

[21] Appl. No.: 904,783

[22] Filed: Sep. 4, 1986

Related U.S. Application Data

[63] Continuation of Ser. No. 645,632, Aug. 30, 1984, abandoned.

[30] Foreign Application Priority Data

Sep. 30, 1983 [GB] United Kingdom ................ 8326220

[51] Int. Cl.$^4$ ..................................... H01F 13/02
[52] U.S. Cl. .................................... 361/234; 361/230
[58] Field of Search ............... 361/233, 234, 230; 269/329, 909; 279/1 M

[56] References Cited

U.S. PATENT DOCUMENTS 3,582,730  6/1971  Teston ................................. 361/234
4,184,188  1/1980  Briglia ................................ 361/234
4,480,284 10/1984  Tojo et al. ....................... 361/230 X
4,502,094  2/1985  Lewin et al. ........................ 361/234

FOREIGN PATENT DOCUMENTS 1043298  9/1966  United Kingdom ................ 361/234
1443215  7/1976  United Kingdom .

Primary Examiner—Michael L. Gellner
Assistant Examiner—D. Rutledge
Attorney, Agent, or Firm—Robert T. Mayer

[57] ABSTRACT

An electrostatic chuck (1) for holding a semiconductor wafer (5) comprises a dielectric layer (4) on a supporting electrode (2). The wafer is clamped flat against the dielectric layer when a potential difference is applied between the wafer and the electrode. The dielectric is loaded with a thermally conductive material to improve the dissipation of heat generated in the wafer during a processing treatment such as exposure to an electron beam. The dielectric also has charge retention properties so that the wafer can be transported still clamped to the chuck without the need for a permanent electrical connection nor additional mechanical clamping members.

7 Claims, 1 Drawing Figure

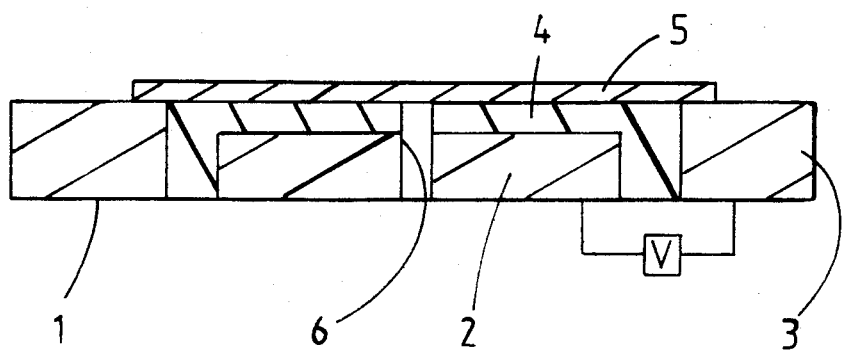

ELECTROSTATIC CHUCK

This is a continuation division of application Ser. No. 645,632, filed Aug. 30, 1984.

This invention relates to an electrostatic chuck for holding a semiconductor wafer in intimate contact therewith under the action of Coulombic forces.

In the manufacture of semiconductor devices it is sometimes necessary to clamp a semiconductor wafer substantially flat against a support during certain processing treatments. Such a processing treatment involves directing charged particles towards the wafer. For example, selected arear of the wafer can have their conductivity type modified by the implantation of ions. As another example, an electron sensitive resist may be coated on the wafer surface and the resist can then be exposed to a beam of electrons. For these processing treatments it is known to clamp the semiconductor wafer using an electrostatic chuck in the processing apparatus.

It is noted here that an electrostatic chuck for holding a semiconductor wafer can be used generally for holding a substrate other than a semiconductor wafer having at least some electrically conducting properties.

United Kingdom Pat. No. 1,443,215 discloses an electrostatic chuck which comprises a layer of dielectric material on an electrically conductive support member. A semiconductor wafer can be located on the chuck so as to bear against the dielectric layer. On applying a potential difference between the wafer and the conductive support member an electrostatic force is set up across the dielectric layer whereby the wafer is clamped substantially flat against the dielectric layer. When the potential difference is not applied the wafer is released and so it can readily by removed from the chuck. For loading and unloading the processing apparatus with the wafer on the chuck it is inconvenient to arrange for the chuck and wafer to remain connected to a voltage source and therefore some other form of retaining means such as mechanical clamps or a lip have to be employed on the chuck. These retaining means can cause the wafer to be distorted leading to irreproducible processing errors.

Moreover, processing treatments involving the use of beams of charged particles as mentioned above are responsible for the generation of thermal energy in the wafer. This thermal energy can cause expansion and distortion of the wafer if the heat generated cannot readily be dissipated. Generally the thermal conductivity of dielectric materials is relatively low. As the wafer is clamped against the dielectric this can act as a barrier to the efficient heat flow from the wafer to the conductive supporting member.

European patent application No. 0074691 discloses an electrostatic chuck with improved thermal conduction from the wafer. This chuck comprises thermally conductive pillars extending through the dielectric layer and engaging the back of the semiconductor wafer. In this case the electrically conductive member has the form of a grid and the thermally conductive pillars extend through the meshes of the grid. The structure of this electrostatic chuck is relatively complex and difficult to make.

According to the present invention there is provided an electrostatic chuck for holding a semiconductor wafer in intimate contact therewith under the action of Coulombic forces, comprising a layer of dielectric material on an electrically conductive member, the dielectric material being adapted enhanced thermal conduction and capable of charge retention.

An electrostatic chuck in accordance with the invention combines the advantages of efficient heat dissipation from the wafer, with relative simplicity of structure. However, the material of the dielectric layer is not only adapted for enhanced thermal conduction but also it is capable of retaining charge. Thus once the wafer and the electrically conductive member have been connected to a voltage source the wafer remains held against the chuck even after disconnection from the voltage source. This is a significant advantage enabling the semiconductor wafer to remain held on the chuck for general handling and particularly for loading and unloading the processing apparatus without the need for the wafer and chuck to remain connected to a voltage source, and without the need for mechanical retaining means and the attendant disadvantages mentioned above.

When located in the processing apparatus, however, a voltage source my be connected across the wafer and chuck to provide even firmer clamping during processing. To facilitate connection to the wafer the chuck may comprise means for electrically contacting the semiconductor wafer.

In one embodiment of the invention the electrical contact means are in the form of an electrically conducting annulus surrounding the conductive member, the annulus being thicker than and spaced apart from the electrically conductive member. Preferably the dielectric layer bonds the annulus and the electrically conductive member together.

Applicants have found that the dielectric layer of the electrostatic chuck has surprisingly effective charge retention and thermal conduction when it comprises epoxy resin loaded with a material such as particulate alumina having a relatively high thermal conductivity. With this material the residual charge leaks away slowly allowing the wafer to be released easily after about 24 hours. In order to remove the wafer more immediately the electrostatic chuck may be provided with ducting means, for example a centrally disposed aperture extending through the thickness of the dielectric layer and the electrically conductive member, whereby jets of air can be used to release the wafer as descried in more detail below.

An embodiment of the invention will now be described, by way of example, with reference to the accompanying drawing in which:

the single FIGURE is a cross sectional view of a semiconductor wafer held on an electrostatic chuck in accordance with the invention.

The electrostatic chuck 1 comprises an electrically conductive member in the form of a circular aluminium plate 2 which is 92 mm in diameter and 5.3 mm thick. Plate 2 is surrounded by contact means in the form of an aluminium annulus 3 having an external diameter of 150 mm and an internal diameter of 96 mm. The thickness of annulus 3 is 5.5 mm. Plate 2 is centrally disposed with respect to annulus 3. The space between the plate 2 and the annulus 3 is filled with epoxy resin, in particular Araldite (trade mark), loaded with particulate alumina or mica. A suitable loaded epoxy is commercially available from Messrs. Emerson and Cuming, Canton, Mass. U.S.A. under the trade mark Stycast 2651. Above the plate 2 the epoxy resin is filled to the level of the annulus 3 to form a dielectric layer 4. The thickness of dielectric layer 4 is approximately 200 micrometers. The upwardly directed surface of the dielectric layer 4 and the annulus 3 is made flat to within approximately ±5 micrometers by superfinishing. A 4 inch diameter semiconductor wafer 5 is located centrally on the chuck on the major surface remote from the electrically conductive plate 2. Over the major part of its back surface the wafer 5 is in contact with dielectric layer 4, but around its periphery it is in contact with the aluminium annulus. A portential difference V of typically 3 kv is applied between the plate 2 and the annulus 3. This results in firm effective clamping of the wafer aginst the chuck 1. However when the chick is disconnected from the voltage source V dielectric layer 4 retains charge and the residual charge is sufficient to hold the wafer firmly in place for handling and transport without the need for further retaining means. In this way the wafer can be loaded into processing apparatus, for example an electron image projector, already clamped on the chuck. Inside the processing apparatus the voltage source can be reconnected for maximum clamping during the processing treatment. Heat generated in the wafer during the processing treatment readily flows away through the dielectric layer 4 to the plate 2 which acts as a heat sink. After the processing treatment has been carried out the voltage source can be disconnected and the wafer removed from the apparatus still held in place on the chuck against because of the residual charge in the dielectric layer.

Applicants have found that the residual charge leaks away slowly allowing the wafer to be released easily after about 24 hours. If desired, however, the wafer can be released more immediately simply by prying it off, or preferably with the aid of air jets. In the latter case a duct in the form of a 4 mm diameter aperture 6 with a cicular cross-section is provided at the centre of the chuck extending through the full thickness of the dielectric layer 4 and the plate 2. A jet of air directed vertically from the back side of the chuck, i.e. the side remote from the wafer 5, through the duct 6 towards the back surface of the wafer 5, acts to lift the wafer slightly off the chuck. The wafer 5 can then be floated laterally away from the chuck on a jet of air directed horizontally across the front surface of the chuck. Alternatively, once the wafer has been lifted from the chuck by the vertical air jet the chuck can be tilted for the wafer simply to slide off.

In the light of the above description it will be evident that many modifications may be made within the scope of the present invention. Thus, for example, more than one aperture may be provided in the chuck for ducting the air jets to the back surface of the wafer. As another example the central conductive plate 2 need not be flush with the back surface of the chuck but instead may be buried in—and so fully surrounded by—the dielectric material. In this case the conductive plate 2 is contacted by an electrical connection which passes through the dielectric material at the back side of the chuck.

Although the previous description is directed to holding a semiconductor wafer it is noted here that an electrostatic chuck in accordance with the present invention is also suitable for holding other substrates having at least some electrically conducting properties, for example and electrically conductive substrate or an insulating substrate having a conductive or semiconductive coating or surface region.

We claim:

1. An electrostatic chuck for holding a semiconductor wafer in intimate contact therewith under the action of Coulombic forces, comprising a layer of dielectric material on an electrically conductive member, said dielectric material being loaded with a particulate material of relatively high thermal conductivity so that the layer has enhanced thermal conduction for dissipating heat from a semiconductor wafer held by said chuck, said dielectric material also being capable of charge retention for retaining said wafer in intimate contact with said chuck after both the generation of an electric field therebetween by an applied electric voltage and the discontinuation of the applied voltage which generated said electric field.

2. An electrostatic chuck as claimed in claim 1, further comprising electrical contact means for electrically contacting the semiconductor wafer.

3. An electrostatic chuck as claimed in claim 2, wherein the electrical contact means is in the form of an electrically conducting annulus surrounding the electrically conductive member, the annulus being thicker than the electrically conductive member.

4. An electrostatic chuck as claimed in any of the preceding claims, wherein the electrically conductive member and the electrical contact means are bonded together in spaced relation by the dielectric layer.

5. An electrostatic chuck as claimed in claim 4, wherein the dielectric material comprises epoxy resin loaded with a material having a relatively high thermal conductivity.

6. An electrostatic chuck as claimed in claim 5, wherein the epoxy resin is loaded with particulate mica or alumina.

7. An electrostatic chuck as claimed in claim 6, further comprising ducting means extending through the thickness of the dielectric layer and the electrically conductive member.

* * * * *